United States Patent [19]
Frantz et al.

[11] Patent Number: 5,012,145
[45] Date of Patent: Apr. 30, 1991

[54] ROTATING RECTIFIER ASSEMBLY FOR BRUSHLESS GENERATOR

[75] Inventors: Gary A. Frantz, Belvidere; Mohd A. Aleem, Roscoe; Loren Rademacher; Lee R. Rateike, both of Rockford, all of Ill.

[73] Assignee: Sundstrand Corporation, Rockford, Ill.

[21] Appl. No.: 429,045

[22] Filed: Oct. 30, 1989

[51] Int. Cl.$^5$ ...................... H02K 11/00; H02M 1/00
[52] U.S. Cl. .................................. 310/68 D; 310/71
[58] Field of Search ................... 310/42, 43, 68 D, 71, 310/89; 363/145

[56] References Cited

U.S. PATENT DOCUMENTS

| 4,307,437 | 12/1981 | Severing | 310/68 D |
| 4,570,094 | 2/1986 | Trommer | 310/68 D |
| 4,581,695 | 4/1986 | Hoppe | 310/68 D |
| 4,670,678 | 2/1987 | Jäger et al. | 310/68 D |
| 4,794,510 | 12/1988 | Wege | 310/68 D |
| 4,795,932 | 1/1989 | Long | 310/43 |

FOREIGN PATENT DOCUMENTS

| 1210942 | 2/1966 | Fed. Rep. of Germany | 310/68 D |
| 1334288 | 8/1987 | U.S.S.R. | 310/68 D |
| 1017026 | 1/1966 | United Kingdom | 310/68 D |

Primary Examiner—Steven L. Stephan
Assistant Examiner—D. L. Rebsch
Attorney, Agent, or Firm—Wood, Phillips, Mason, Recktenwald & VanSanten

[57] ABSTRACT

The high cost of fabricating a rotating rectifier assembly may be reduced in a construction including first and second tubular, generally cylindrical housing sections (12), (14), of insulating material in end to end abutment. Each of the sections (12), (14), has an interior wall (28), (40) including an elongated, inverted T-shaped slot (60) with the slot (60) in one of the sections (12) being circumferentially spaced from the slot (60) and the other of the sections (14) by about 180 degrees. Elongated buses (70) are located in the widest part of each of the slots (60) and each includes plural packaged diode mounting apertures (72). Packaged diodes 74 have combination terminal/mounting posts (76) located in a corresponding aperture (72) and further include an opposite terminal (80) extending to the interior wall (28), (40) opposite the corresponding slot (60). Fasteners (78) within the slots (60) secure the combination terminal/mounting posts (76) to the corresponding bus (70) in electrical contact therewith.

8 Claims, 1 Drawing Sheet

ROTATING RECTIFIER ASSEMBLY FOR BRUSHLESS GENERATOR

FIELD OF THE INVENTION

This invention relates to rectifier assemblies, and more particularly, to a full wave, three-phase rectifier assembly which is particularly suited to be mounted on the rotor of, for example, a brushless generator to provide direct current for the main field winding from alternating current generated by an exciter.

BACKGROUND OF THE INVENTION

In many applications for synchronous generators, it is highly desirable to eliminate brushes since they require somewhat frequent maintenance and/or replacement, as well as introduce noise into the power being generated. They are, perhaps, the single weakest point in the system. In order to eliminate brushes, brushless generator systems have been proposed wherein rotating permanent magnets on a dynamoelectric machine rotor act as a permanent magnet generator, or a PMG, generating alternating current in a stator winding. The alternating current from the PMG stator winding is rectified by a stationary rectifier and the resulting direct current is utilized to provide a magnetic field for a so-called 'exciter.' The magnetic field for the exciter is, of course, stationary meaning that current will be induced on a winding carried by the rotor which is typically a three-phase winding. This three-phase alternating current is then rectified by a rotating rectifier carried on the rotor to provide direct current for the rotating field of the main generator. As a consequence of the rotating field, alternating current is generated in a stationary stator winding of the main generator.

Systems of this sort are frequently employed in aircraft power systems and, as a consequence, they must be highly reliable with the rotary components having the ability to withstand high rotative speeds that may exceed 24,000 rpm.

Moreover, space and weight are always of concern in airborne systems and substantial efforts have been expended in developing machines of this sort. Illustrative examples may be found in the following U.S. Pat. Nos. 4,628,219 issued Dec. 9, 1986 to Troscinski; 4,745,315 issued May 17, 1988 to Terry, et al.; 4,794,510 issued Dec. 27, 1988 to Wege; and 4,806,814 issued Feb. 21, 1989 to Nold.

The Nold, Troscinski and Terry constructions generally employ so-called diode wafers, that is, semi-conductor wafers that are unpackaged, i.e., without housings and/or terminals, to develop compact assemblies. While these assemblies work extremely well for their intended purpose, considerable precision must be exercised in assuring that good electrical contact is made between the diode wafers and the various buses or other electrically conducting components utilized; and that tends to add to the cost of the assemblies.

Wege, on the other hand, utilizes packaged diodes which considerably cuts the expense of assuring good electrical contact between diode wafers contained within the packages and the respective terminals on the packages, since this is accomplished by mass production techniques in a reliable fashion Wege, however, utilizes such diodes in a way that the resulting rectifier assembly has a relatively large diameter. The present invention seeks to achieve the cost advantages that attend the use of the Wege type construction in a rectifier assembly of substantially lesser diameter.

SUMMARY OF THE INVENTION

It is the principal object of the invention to provide a new and improved rotating rectifier assembly. More particularly, it is an object of the invention to provide such an assembly that utilizes conventional packaged diodes so as to minimize manufacturing expense.

An exemplary embodiment of the invention achieves the foregoing objects in a housing of insulating material. Elongated, peripherally spaced slots are located internally of the housing and each has a relatively narrow opening and a relatively wider interior channel Elongated buses, each of a width greater than the width of the openings, are disposed in each of the interior channels and each bus has a plurality of terminal receiving openings therein.

A plurality of packaged diodes have terminal posts disposed in corresponding ones of the terminal openings to be in electrical contact with the corresponding bus and further extend through a corresponding one of the narrow openings towards the opposite side of the housing.

In a highly preferred embodiment, the housing is elongated and the slots are axially spaced therein.

The invention contemplates that the housing be formed of axially abutting housing sections, each having at least one of the slots on its interior.

Preferably, the sections are generally cylindrical an when such is the case, the slots are circumferentially spaced from one another by approximately 180 degrees to balance the housing in the rotative sense.

The invention contemplates that the housing may include end closures with at least one of the end closures including input and/or output terminals.

In a highly preferred embodiment, an end closure for the housing includes an integral bobbin and a wound resistor is disposed on the bobbin, the resistor being adapted to be connected in shunt relation across the output of the rectifier, as is well known.

In a highly preferred embodiment, the slots are located as opposed, elongated, inverted T-shaped slots. The slots may also receive fasteners for securing the diodes to the corresponding bus in electrical contact therewith.

Other objects and advantages will become apparent from the following specification taken in connection with the accompanying drawings.

DESCRIPTION OF THE PREFERRED EMBODIMENT

Figure 1:
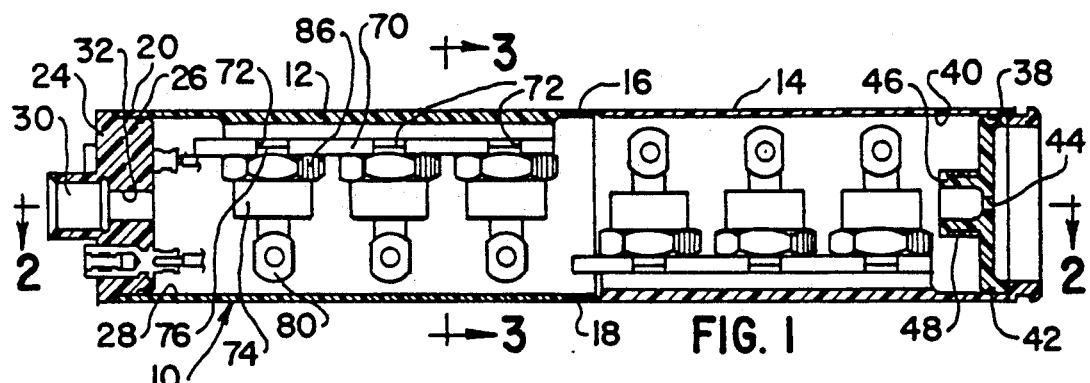
FIG. 1 is a sectional view of a rotating rectifier assembly made according to the invention.

An exemplary embodiment of a rotating rectifier assembly made according to the invention is illustrated in the drawings and with reference to FIG. 1 is seen to include a housing, generally designated 10. The housing 10 is preferably cylindrical in shape and formed of an insulating material. Typically, Torlon ® or polyether etherketone may be utilized according to conventional compression molding techniques to form the housing 10.

As illustrated, the housing 10 is formed of two housing sections, 12 and 14, in end-to-end relationship. The sections 12 and 14 are identical save for the fact that at the end adjacent to housing 14, the housing 12 has a reduced diameter section 16 that acts as a pilot for the end 18 of the housing section 14.

Figure 4:
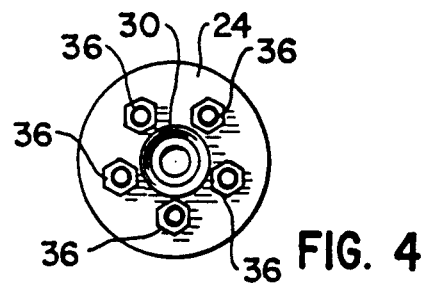
FIG. 4 is an end elevation of the rectifier assembly.

One end 20 of the housing section 12 is sealed by an end cap or closure 24 including a peripheral O-ring 26 in sealing engagement with the interior wall 28 of the housing section 12. The closure 24 includes a central port 30 which may receive a transfer tube (not shown) whereby coolant in the form of hydraulic oil, for example, may be introduced into the interior of the housing 10 via a passage 32. As seen in FIG. 4, the closure 24 also mounts equally angularly spaced input and output terminals 36. As is well known, two of the terminals 36 will be output terminals providing direct current to the main field winding, while the remaining three terminals 36 will receive a corresponding phase of the three-phase alternating current from the exciter.

Oppositely of the closure 24, the housing section 14 includes an end closure 38 which is also sealed to the interior 40 of the housing section 14 by means of an O-ring 42. If desired, certain of the terminals 36 could be located in the end closure 38 depending upon the actual construction of the rotor of the dynamoelectric machine with which the assembly is to be used. The end closure 38 includes an outlet port 44 from which oil conveyed to the interior of the housing 10 may exit the same after cooling the components therein Disposed centrally about the port 44 and within the housing 10, the closure 38 includes an integral bobbin 46 upon which is wound a conductor 48 of relatively high resistance to form a wound resistor. Alternatively, the bobbin 46 may be separate from the closure 38 if desired.

As is well known, the wound resistor defined by the wire 48 is typically placed across the output leads 50 and 52 of the rectifier (FIG. 5) and is shunt relation with the main field winding 54 for the purpose of eliminating or minimizing spikes that occur as the various diodes switch from conducting to non-conducting to conducting states.

Figure 3:
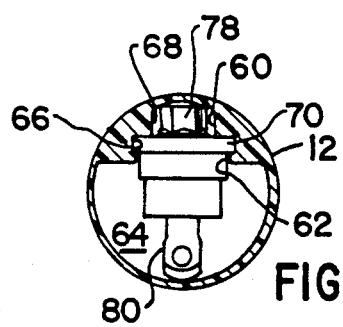
FIG. 3 is a sectional view taken approximately along the line 3—3 in FIG. 1.

Referring to FIG. 3, the housing section 12 and 14 will now be described. The two are identical except as noted earlier with one rotated 180 degrees to the other. Thus only the housing section 12 will be described and is seen to include an interior slot 60 on one side that can be considered somewhat in the form of an inverted T. That is to say, the same has a relatively narrow opening 62 to the interior 64 of the housing section 12 and a relatively wider base or channel section 66. In the illustrated embodiment, the slot 60 also includes a bottom trough or groove 68.

Slidably received within the channels or bases 66 are plates or buses 70 formed of conductive materials such as copper. The plates 70 have a width greater than the width of the openings 62 as can be seen from FIG. 3 and, thus, are restrained against radial movement within the slots 60. As can be seen in FIG. 1, the plates or buses 70 include a plurality of packaged diode mounting openings 72 in axially spaced relationship along their length.

Conventional packaged diodes 74 have threaded, combination terminal/mounting posts 76 which are received in the openings 72 so as to be secured to the buses 70 by means of nuts 78 threaded on the combination terminal/mounting posts 76.

As is well known, each combination terminal/mounting post 76 is connected to either the anode or the cathode of a semiconductor diode wafer (not shown) within each packaged diode 74.

Extending oppositely of the combination terminal/mounting posts 76 is another terminal 80 which is connected to the other element of the diode, and which extends into close adjacency to that part of the interior wall 28 opposite from the slot 60.

Figure 2:
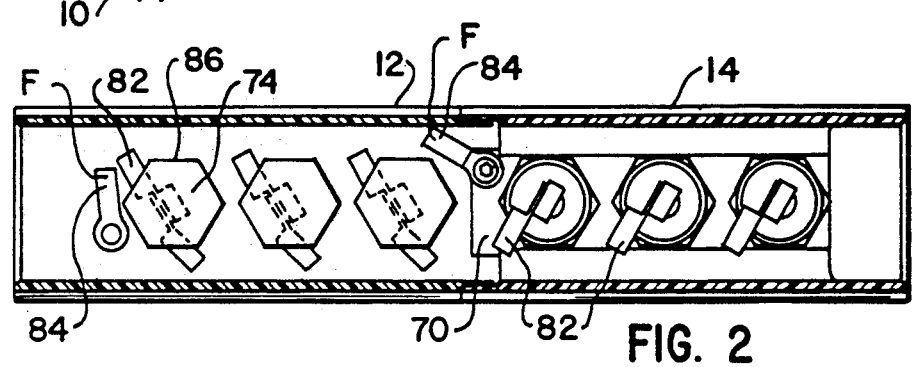
FIG. 2 is a sectional view taken approximately along the line 2—2 in FIG. 1.

Flexible conductors (not shown in FIGS. 1-4) are connected to mounting clips 82 (FIG. 2) mounted to the terminals 80 and to mounting clips 84 which are mounted to the buses 70. The resulting connections are extended to the terminals 36 (FIG. 4).

An interesting feature of the invention is the fact that a typical packaged diode 74 has a hex configuration shown at 86 in the various figures The width of the narrow opening 62 of the slot 60 is just slightly greater than the distance between opposite faces of the hex configuration 86. Consequently, when the diodes 74 are mounted to the buses 70, as illustrated, and the buses 70 introduced in the respective ones of the slots 60, the diodes 74 cannot rotate by reason of their confinement within the narrow opening 62 of the slot 60 to assure that a good connection will be maintained.

Figure 5:
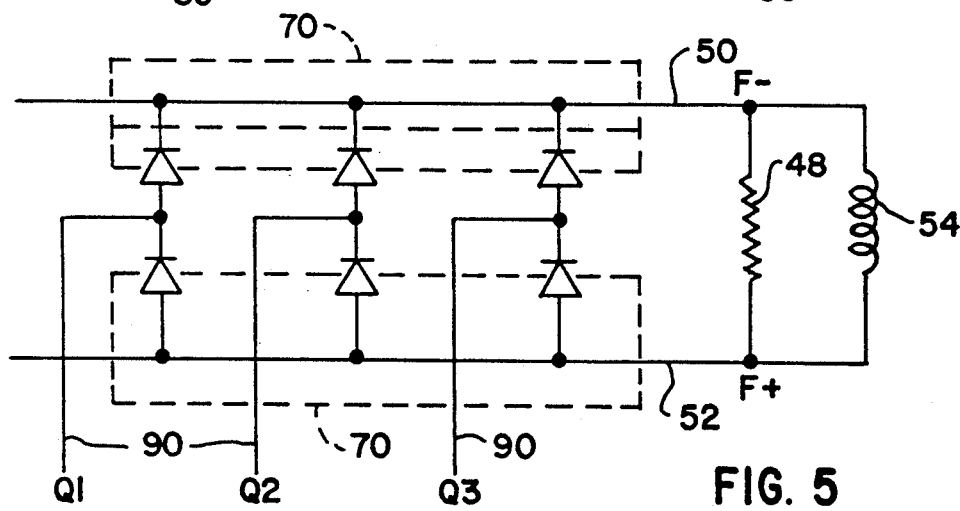
FIG. 5 is a schematic.

FIG. 5 schematically illustrates the electrical configuration of the assembly with the buses 70 being shown in dotted lines. The leads shown at 90 are input leads for the various phases and are, of course, connected to appropriate ones of the clips 82 via the terminals 36 while the clips 84 are ultimately in electrically conductive relation with the field leads 50 and 52.

From the foregoing, it will be appreciated that a rotating rectifier assembly made according to the invention advantageously employs packaged diodes and is of the simple construction so as to allow the same to be manufactured economically. Electrical connections are extremely simple due to the use of the plates 70 as both buses and mounting devices for the packaged diode. The construction provides a package of small diameter

We claim:

1. A rectifier assembly for mounting in a rotor comprising:
    a housing of insulating material;
    elongaged, peripherally spaced slots internally of said housing, each having a relatively narrow opening and a relatively wider interior channel;
    elongated buses of a width greater than said openings and disposed in the interior channel of a corresponding one of said slots, each said bus having plural terminal openings therein; and
    a plurality of packaged diodes each having a terminal post, each said diode having its terminal post mounted in one of said terminal openings to be in electrical contact with the corresponding bus and extending through a corresponding one of said narrow openings toward the opposite side of said housing.

2. The rectifier assembly of claim 1 wherein said housing is elongated and said slots are axially spaced therein.

3. The rectifier assembly of claim 1 wherein said housing is formed of axially abutting housing sections, each having at least one of said slots on its interior.

4. The rectifier assembly of claim 3 wherein said sections are generally cylindrical.

5. The rectifier assembly of claim 3 further including end closures for said housing, at least one of said closures including input and/or output terminals.

6. The rectifier assembly of claim 3 further including an end closure for said housing, said end closure including an integral bobbin, and a wound resistor disposed on said bobbin.

7. A rotary rectifier assembly comprising:
a tubular housing having an interior wall, at least part of which is formed of insulating material;
opposed elongated, inverted T-shaped slots in said wall part;
elongated buses in said slots; and
a plurality of prepackaged diodes mounted on each of said buses by a packaged diode terminal so as to be electrically connected to the corresponding bus and projecting out of the corresponding slot.

8. A rotary rectifier assembly comprising:
first and second tubular, generally cylindrical housing sections of insulating material in end to end abutment;
each of said sections having an interior wall including an elongated, inverted T-shaped slot, the slot in one of said sections being circumferentially spaced from the slot in the other section by about 180 degrees;
an elongated bus located in the widest part of each said slot, each bus including plural packaged diode mounting apertures extending therethrough in spaced relation and facing the interior of the corresponding housing section through the associated slot;
a plurality of packaged diodes, each having a combination terminal/mounting post located in a corresponding aperture and an opposite terminal extending into adjacency with the interior wall opposite the corresponding slot; and
fasteners within said slots securing said combination terminal/mounting posts to the corresponding bus in electrical contact therewith.

* * * * *